United States Patent
Barbato

(10) Patent No.: US 10,154,615 B2
(45) Date of Patent: Dec. 11, 2018

(54) CONDITIONING UNIT OF THE INDIRECT FREE COOLING TYPE, METHOD OF OPERATION OF SUCH A CONDITIONING UNIT, AND APPARATUS FOR CARRYING OUT SUCH METHOD

(71) Applicant: EMERSON NETWORK POWER S.R.L., Piove di Sacco (IT)

(72) Inventor: Pierpaolo Barbato, Noventa Padovana (IT)

(73) Assignee: EMERSON NETWORK POWER S.R.L., Piove di Sacco (IT)

( * ) Notice: Subject to any disclaimer, the term of this patent is extended or adjusted under 35 U.S.C. 154(b) by 320 days.

(21) Appl. No.: 14/950,700

(22) Filed: Nov. 24, 2015

(65) Prior Publication Data
US 2016/0150682 A1 May 26, 2016

(30) Foreign Application Priority Data
Nov. 24, 2014 (IT) .............................. PD2014A0319

(51) Int. Cl.
*H05K 7/20* (2006.01)
*F24F 11/00* (2018.01)
(Continued)

(52) U.S. Cl.
CPC ...... *H05K 7/20745* (2013.01); *F24F 11/0001* (2013.01); *F24F 11/30* (2018.01);
(Continued)

(58) Field of Classification Search
CPC ............... F24F 11/0001; F24F 11/0012; F24F 11/0015; F24F 11/006; F24F 11/0079;
(Continued)

(56) References Cited

U.S. PATENT DOCUMENTS 4,437,608 A * 3/1984 Smith ................... F24F 11/0001
236/13
2007/0032187 A1* 2/2007 Liu ....................... F24F 11/0001
454/186
(Continued)

FOREIGN PATENT DOCUMENTS

EP 2555604 A1 2/2013

*Primary Examiner* — Emilio J Saavedra
(74) *Attorney, Agent, or Firm* — Scully, Scott, Murphy & Presser, P.C.

(57) ABSTRACT

A conditioning unit of the indirect free cooling type, particularly for conditioning computing centers, of the type comprising:
an air/air heat exchanger, inside which two air flows, exchange heat: a primary air flow from and toward an environment to be air-conditioned, and a secondary air flow, or process flow, drawn from outside,
first fans for moving the primary air flow,
second fans for moving the secondary air flow.
The conditioning unit comprises:
elements for detecting temperature and humidity for the primary flow and the secondary flow at the inlet of the conditioning unit and for the primary flow at the delivery toward an environment to be air-conditioned,
elements for detecting the flow-rate of the primary flow and of the secondary flow,
elements for detecting the electric power absorbed by the first fans and the second fans,
an electronic control and management unit adapted to collect and process the data detected by the detection elements and, on the basis of the detected data, adapted to adjust the speed of the first fans and the second fans.

10 Claims, 2 Drawing Sheets

(51) Int. Cl.
*F24F 12/00* (2006.01)
*G05B 15/02* (2006.01)
*F24F 11/81* (2018.01)
*F24F 11/30* (2018.01)
*F24F 11/77* (2018.01)
*F24F 11/62* (2018.01)
*F24F 110/12* (2018.01)
*F24F 11/63* (2018.01)
*F24F 140/50* (2018.01)
*F24F 110/20* (2018.01)
*F24F 110/10* (2018.01)
*F24F 11/46* (2018.01)
*F24F 140/60* (2018.01)
*F24F 110/22* (2018.01)

(52) U.S. Cl.
CPC .............. *F24F 11/62* (2018.01); *F24F 11/77* (2018.01); *F24F 11/81* (2018.01); *F24F 12/001* (2013.01); *G05B 15/02* (2013.01); *H05K 7/20836* (2013.01); *F24F 11/46* (2018.01); *F24F 11/63* (2018.01); *F24F 2011/0002* (2013.01); *F24F 2110/10* (2018.01); *F24F 2110/12* (2018.01); *F24F 2110/20* (2018.01); *F24F 2110/22* (2018.01); *F24F 2140/50* (2018.01); *F24F 2140/60* (2018.01)

(58) Field of Classification Search
CPC .................. F24F 11/027; F24F 12/001; F24F 2011/0002; F24F 2011/0013; F24F 2011/0016; F24F 2011/0046; F24F 2011/0047; F24F 2011/0061; F24F 11/81
USPC ........................................................ 700/276
See application file for complete search history.

(56) References Cited

U.S. PATENT DOCUMENTS

| | | | |
|---|---|---|---|
| 2010/0010678 A1 | 1/2010 | Dawson et al. | |
| 2010/0252231 A1 | 10/2010 | Tozer et al. | |
| 2011/0306288 A1 | 12/2011 | Murayama et al. | |
| 2012/0171943 A1* | 7/2012 | Dunnavant | H05K 7/20745 454/184 |
| 2013/0138253 A1* | 5/2013 | Chainer | G05D 7/0635 700/282 |
| 2016/0076831 A1* | 3/2016 | Marchetti | F28F 27/02 165/300 |

* cited by examiner

CONDITIONING UNIT OF THE INDIRECT FREE COOLING TYPE, METHOD OF OPERATION OF SUCH A CONDITIONING UNIT, AND APPARATUS FOR CARRYING OUT SUCH METHOD

The present invention relates to a conditioning unit of the indirect free cooling type, particularly for conditioning computing centers, a method of operation of such a conditioning unit, and an apparatus for carrying out such method.

Conditioning units of the free cooling type usually comprise an air/air exchanger that uses the cold air from outside to cool the warm air returning from the environment to be air-conditioned, for example a computing center.

Usually such conditioning units are set up in order to ensure:
the same temperature at the delivery, i.e., the temperature of the air emitted by the conditioning unit toward the environment to be air-conditioned, all year round, for example 25° C.,
and, based on the demand for cooling, the return temperature, i.e. the temperature of the air exiting from the environment to be air-conditioned, for example 37° C.,
and the air flow necessary to attain such objective is determined on the basis of such data.

Usually, the operation in winter of a conventional conditioning unit results in an electricity consumption of the fans that provide the primary air flow, i.e. the air flow originating from and directed toward an environment to be air-conditioned, for example a computing center, which is considerably higher than the electricity consumption of the "process" fans, i.e. the fans that provide the flow of air from outside which is used to obtain the necessary cooling capacity.

Nowadays, in the sector of conditioning computing centers with conditioning units that use indirect free cooling, the systems for adjusting the flow-rate of the air of the primary flow are designed to maintain a fixed temperature range between the area in front of a server, arranged inside the computing center, and an outlet from that server.

Such adjustment systems can be based, for example,
on reading a temperature probe at the delivery and one at the return of the primary flow,
or
on reading a probe at the delivery and reading a differential pressure sensor between the delivery and the return, which is adapted to detect, except in the event of leaks, that the temperature delta is stable, the air flow-rate of the internal cooling fans of the servers being self-adjusting and directly proportional to the consumption,
or
on reading a temperature probe at the delivery and reading a signal proportional to the electricity consumption of the servers, outside of the conditioning unit.

Furthermore, since the capacity of the free cooling system is directly linked to the temperature at the delivery, proportionally to the outside temperatures, all conditioning machines that use indirect free cooling set the temperature of the air flow at the delivery in the environment to be air-conditioned to the maximum that can be accepted by the type of server installed.

An in-depth analysis of the known art shows that the power dissipated by a server in a computing center is influenced by the temperature of the area in front of that server.

In particular the power absorbed by a server increases considerably when the temperature of the air aspirated by that server is higher than 20° C.

The increase in power absorbed by the server is the result of supplying power to the cooling fan, of the power dissipated by each component of the server, and of the conversion of power for each server.

The increase in the power dissipated by each component is the result of a non-negligible loss of current of some silicon devices.

The aim of the present invention is to provide a conditioning unit of the indirect free cooling type, particularly for conditioning computing centers, which is capable of overcoming the above mentioned drawbacks of the conventional units.

In particular, an object of the invention is to provide a method of operation of such a conditioning unit.

A further object of the invention is to provide an apparatus for carrying out such method.

Within this aim, another object of the invention is to provide a conditioning unit that is capable of carrying out a more efficient heat exchange than similar, conventional conditioning units.

Another object of the invention is to provide a conditioning unit the electricity consumption of which is lower overall with respect to similar, conventional conditioning units.

Another object of the invention is to provide a conditioning unit that is capable of improving the electrical efficiency of the computing center in which it is installed.

This aim and these and other objects which will become better apparent hereinafter are achieved by a conditioning unit of the indirect free cooling type, particularly for conditioning computing centers, of the type comprising:
an air/air heat exchanger, inside which two air flows, exchange heat: a primary air flow from and toward an environment to be air-conditioned, and a secondary air flow, or process flow, drawn from outside,
first fans for moving said primary air flow,
second fans for moving said secondary air flow,
characterized in that it comprises:
means for detecting temperature and humidity for the primary flow and the secondary flow at the inlet of said conditioning unit, and for said primary flow at the delivery toward an environment to be air-conditioned,
means for detecting the flow-rate of the primary flow and of the secondary flow,
means for detecting the electric power absorbed by said first fans and said second fans,
an electronic control and management unit adapted to collect and process the data detected by said detection means and, on the basis of said detected data, adapted to adjust the speed of said first fans and said second fans.

Further characteristics and advantages of the invention will become better apparent from the detailed description that follows of a preferred, but not exclusive, embodiment of the conditioning unit according to the invention, which is illustrated for the purposes of non-limiting example in the accompanying drawings wherein.

Figure 1:
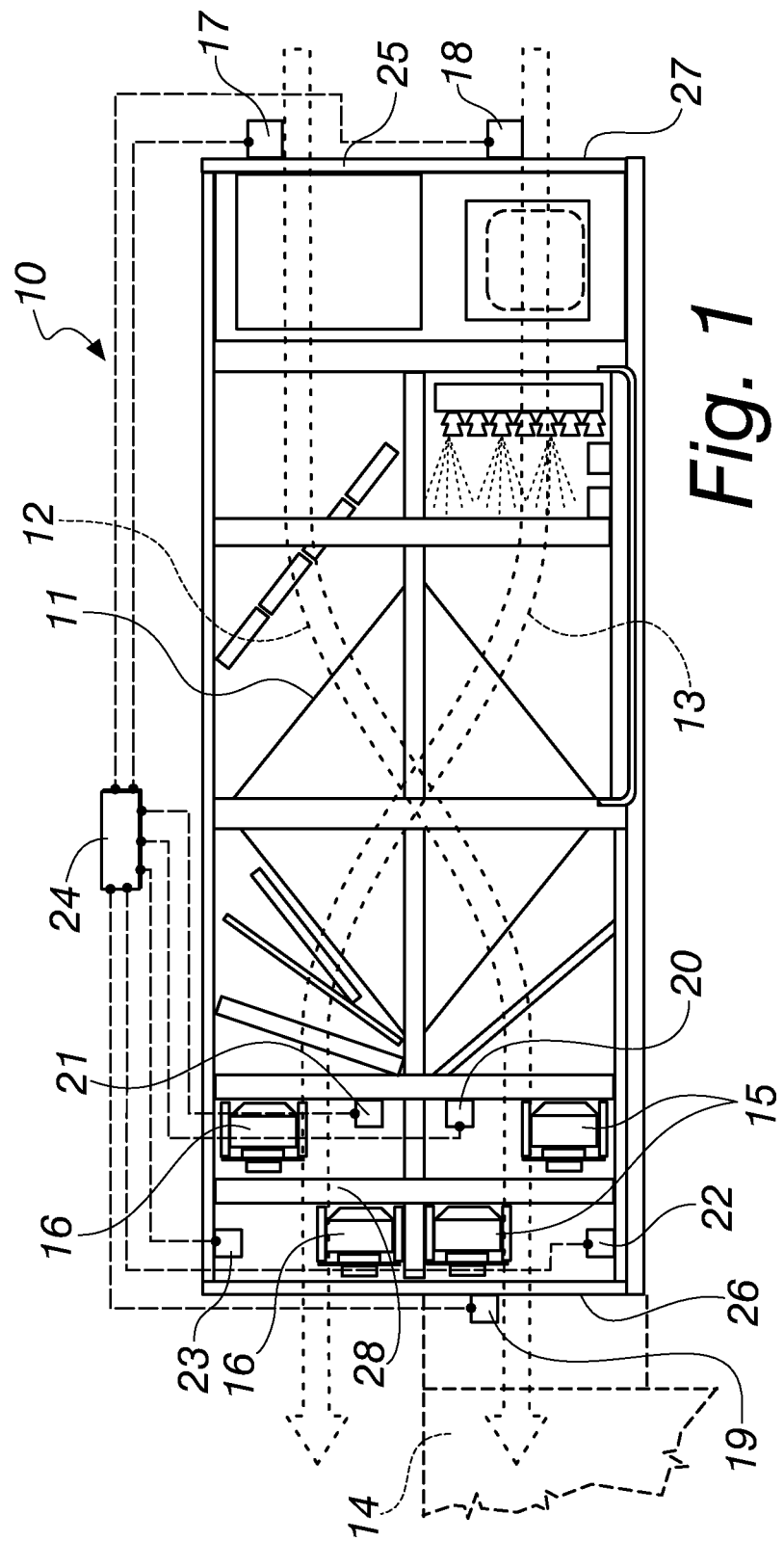
FIG. 1 is a schematic view of a conditioning unit of the indirect free cooling type according to the invention.

With reference to the figures, a conditioning unit of the indirect free cooling type, particularly for conditioning computing centers, is generally designated with the reference numeral 10.

The conditioning unit 10 is of the type comprising:
- an air/air heat exchanger 11, inside which two air flows 12 and 13, exchange heat: a primary air flow 12 from and toward an environment to be air-conditioned 14, for example a computing center, and a secondary air flow 13, or process flow, drawn from outside,
- first fans 15 for moving the primary air flow 12,
- second fans 16 for moving the secondary air flow 13, characterized in that it comprises:
- means 17, 18, 19 for detecting temperature and humidity for the primary flow 12 and the secondary flow 13 at the inlet of the conditioning unit 10, and for the primary flow 12 at the delivery toward an environment to be air-conditioned 14,
- means 20 and 21 for detecting the flow-rate of the primary flow 12 and of the secondary flow 13,
- means 22 and 23 for detecting the electric power absorbed by the first fans 15 and the second fans 16,
- an electronic control and management unit 24 adapted to collect and process the data detected by the detection means 17, 18, 19, 20, 21, 22, 23 and, on the basis of such detected data, adapted to adjust the speed of the first fans 15 and the second fans 16.

The temperature and humidity detection means for the primary flow 12 at the inlet of the conditioning unit 10 are constituted by a first probe 17, which is arranged so as to intercept the primary air flow 12, which arrives from the environment to be air-conditioned 14, at an inlet region 25 of the conditioning unit 10.

The first probe 17 makes it possible to determine the air flow-rate required based on the difference between the temperature detected by the first probe 17 and the temperature of the same primary flow 12 detected by a third probe 19, described below, which is arranged in an outlet region 26 from the conditioning unit 10.

The temperature and humidity detection means for the secondary flow 13 at the inlet of the conditioning unit 10 are constituted by a second probe 18, which is arranged so as to intercept the secondary air flow 13, which arrives from the outside environment, in a corresponding inlet region 27 of the conditioning unit 10.

The second probe 18 is used to estimate the cooling capacity and therefore to adjust the speed of the second fans 16 in a first approximation.

The temperature and humidity detection means for the primary flow 12 at the outlet of the conditioning unit 10, i.e. at the inlet of the environment to be air-conditioned 14, comprise the third probe 19 the readings of which are used for adjusting the power required by the conditioning unit 10.

The means for detecting the flow-rate of the primary flow 12 are constituted by a fourth probe 20 for determining the flow-rate of the primary air flow 12 at the outlet 26 from the conditioning unit 10 toward the environment to be air-conditioned 14.

The fourth probe 20 is constituted, for example, by a hot-wire anemometer, or by a differential pressure probe, or by another type of commercially-available anemometer adapted to the range of flow-rate and air considered.

The means for detecting the flow-rate of the secondary flow 13 are constituted by a fifth probe 21 for determining the flow-rate of the secondary air flow 13, arranged in an outlet region 28 of the secondary flow 13 from the conditioning unit 10 toward the outside.

The fifth probe 21 is constituted, for example, by a hot-wire anemometer, or by a differential pressure probe, or by another type of commercially-available anemometer adapted to the range of flow-rate and air considered.

The means for detecting the electric power absorbed by the first fans 15 comprise a first power measurement device 22 for measuring the power absorbed by the first fans 15.

The first power measurement device 22 can be constituted by a watt-meter; differently, the first power measurement device 22 can form part of the control electronics integrated in the fans, capable of providing an indirect measurement of the power absorbed.

Similarly, the means for detecting the electric power absorbed by the second fans 16 comprise a second power measurement device 23 for measuring the power absorbed by the second fans 16; such measurement device can be a watt-meter or it can form part of the control electronics integrated in the fans, capable of providing an indirect measurement of the power absorbed.

An electronic control unit 24 is designed to execute a reading of the power absorbed by both the first fans 15 and the second fans 16.

The invention also relates to a method of operation of a conditioning unit as described above; such method is characterized in that it comprises the following operations:
- detecting whether the power absorbed by the first fans 15 is greater than the power absorbed by the second fans 16, minus a tolerance interval,
- if the power absorbed by the first fans 15 is greater than the power absorbed by the second fans 16, minus a tolerance interval, then the value of the speed of the first fans 15 is reduced gradually, while at the same time keeping the return temperature of the primary flow 12 constant,
- lowering the speed of the first fans 15 until the following condition is met:

Electric power absorbed by the first fans 15=Electric power absorbed by the second fans 16+tolerance interval.

The minimum temperature at the delivery, i.e. read by third probe 19 at the outlet from the conditioning unit 10 and toward the environment to be air-conditioned 14, is a value that the user can set and which is added to the previous condition of equivalence of the absorbed power values.

Figure 2:
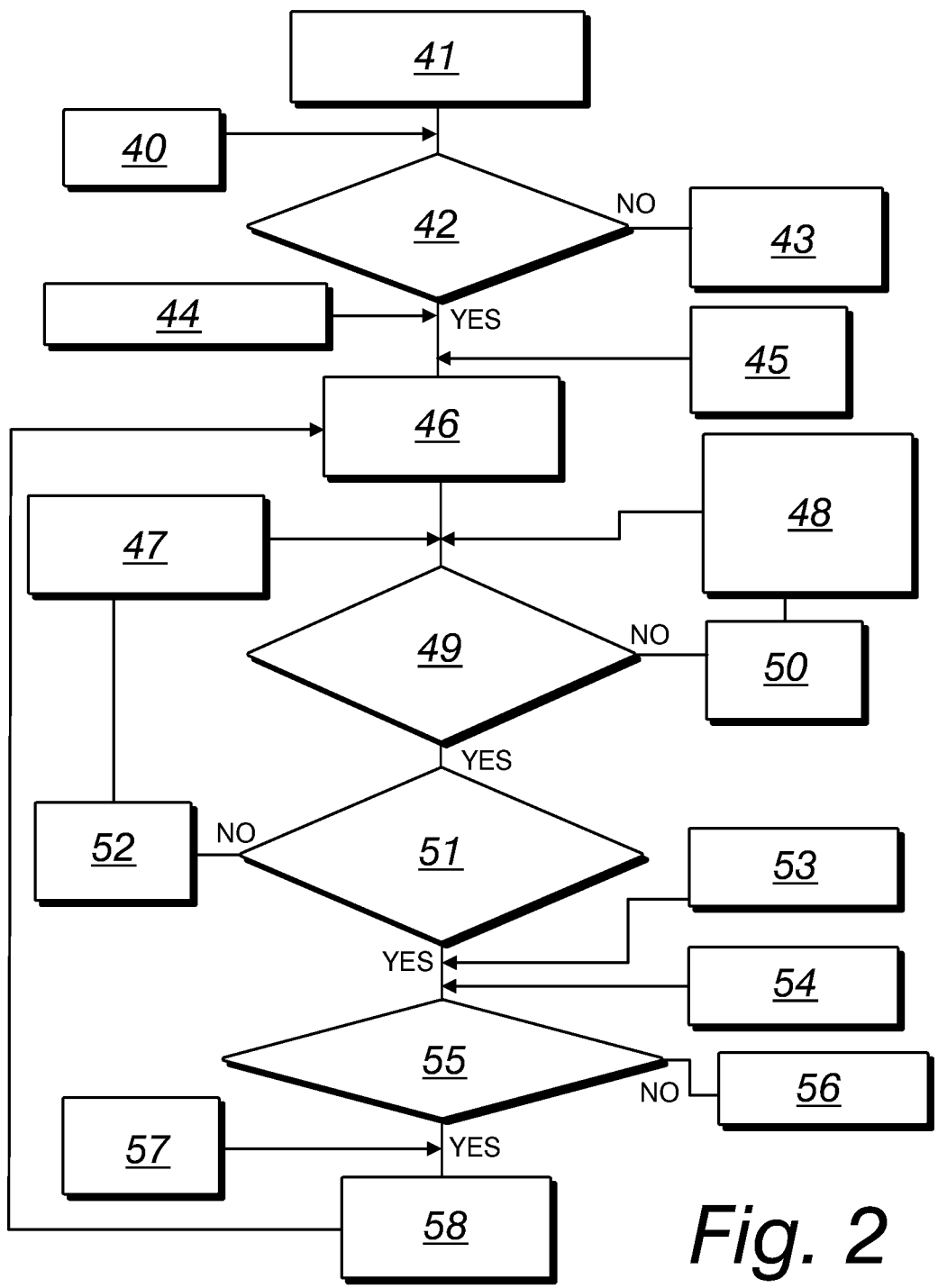
FIG. 2 is a block diagram of a method of operation of a conditioning unit according to the invention.

In particular, the method of operation, shown schematically in FIG. 2, comprises the following operations:
- setting a starting setpoint temperature for the primary flow 12 at the outlet of the conditioning unit 10 toward an environment to be air-conditioned 14, known as the setpoint temperature at the delivery (operation shown schematically by block 40),
- detecting the temperature at the delivery of the primary flow 12 toward the environment to be air-conditioned (operation shown schematically by block 41),
- comparing such detected temperature with the set setpoint temperature (operation shown schematically by block 42), in order to establish whether or not there is a demand for cooling the environment to be air-conditioned 14,
- if there is no demand for cooling, then the conditioning unit 10 remains in standby (block 43),
- if there is demand for cooling, then, after detecting the temperature and humidity of the primary flow 15 that returns from the environment to be air-conditioned 14, by way of the first probe 17 (block 44), and after detecting the external humidity and temperature by way of the second probe 18 (block 45), the electronic control unit 24 adjusts the flow-rate of the air of the primary flow 15 and of the secondary flow 16 (block 46), adjusting the primary air flow 13 by acting on the first fans 15 (block 47), and adjusting the cooling power by acting on the second fans 16, which move the secondary flow 13 (block 48), checking whether the setpoint temperature at the delivery has been reached (block 49), if the setpoint temperature at the delivery has not been reached, then detecting the flow-rate of the secondary flow 13 by way of the fifth probe 21 (block 50), and adjusting the cooling power by acting on the second fans 16, which move the secondary flow 13 (block 48), if the starting setpoint temperature at the delivery has been reached, then (block 51) checking whether the return temperature from the environment to be air-conditioned 14, measured by the first probe 17, complies with the adjustment parameter given by the difference between the temperature at the delivery and the return temperature, if the return temperature does not comply with the adjustment parameters (block 52), then detecting the flow-rate of the primary flow 12 by way of the fourth probe 20 (block 52), and adjusting the speed of the first fans 15, which move the primary flow 12 (block 47), detecting, by way of the first power measurement device 22, the power absorbed by the first fans 15 (block 53), detecting, by way of the second power measurement device 23, the power absorbed by the second fans 16 (block 54), checking whether the electric power absorbed by the first fans 15 is greater than the electric power absorbed by the second fans 16 plus a tolerance interval (block 55), if the electric power absorbed by the first fans 15 is not greater than the electric power absorbed by the second fans 16 plus a tolerance interval, then (block 56) proceed with standard control of the adjustment, i.e. with the value of the starting setpoint temperature at the delivery unaltered, if the electric power absorbed by the first fans 15 is greater than the electric power absorbed by the second fans 16 plus a tolerance interval, then, with respect to a minimum setpoint temperature, which replaces the value of the starting setpoint temperature, set for the delivery from the conditioning unit 10 toward the environment to be air-conditioned 14 (block 57), decreasing the speed of the first fans 15 (block 58), iterating from block 49, with checking whether the setpoint temperature at the delivery has been reached.

The minimum setpoint temperature at the delivery is a value that the user can set.

The first advantage of such method of operation is a reduction of the air flow-rate of the primary flow 15 and an increase of the air flow-rate of the secondary flow 16 in order to meet the different inlet/outlet conditions to/from the air/air exchanger 11.

Since the electricity consumed by the fans is governed by a cubic formula:

Electric power=$f$(air flow-rate)$^3$ decreasing the air flow-rate of the primary fans 15 is therefore convenient even though the air flow-rate of the secondary flow has to be increased by the same percentage, starting from the initial condition with the starting value of the setpoint temperature.

A second advantage obtained thanks to the use of a conditioning unit 10 and of a method of operation according to the invention is constituted by the greater efficiency for the air/air exchanger 11 which is obtained by raising the flow-rate of the secondary air flow 13.

In fact, with a very cold outside temperature, in the known art the secondary flow 13 is usually a laminar flow, while by raising the flow-rate of the secondary flow 13 it circulates with transitions between laminar/turbulent or completely turbulent, with considerable benefits for the heat exchange.

A third advantage derives from sending air to the environment to be air-conditioned 14 at a lower setpoint temperature than the setpoint temperature at the delivery which was set at the start, so that the power absorbed by the electronic equipment, in a computing center, is also lower.

The greater difference between the temperature at the delivery to the environment to be air-conditioned 14, for a computing center with one or more servers within it, and the return temperature from that environment to be air-conditioned 14 is a consequence of the fact that the ventilator cooling fans of the servers adjust their speed so as to keep the heat removed constant; therefore for the same power consumed, a lower temperature in the area in front of a server requires a lower air flow-rate to remove the heat from that server, therefore with a higher temperature delta.

The invention also relates to an apparatus for carrying out the method of operation as described above.

Such apparatus for carrying out a method of operation of a conditioning unit 10 of the type with indirect free cooling, particularly for conditioning computing centers, as described above, is characterized in that it comprises:

the means 17, 18, 19 for detecting temperature and humidity for the primary flow 12 and the secondary flow 13 at the inlet of the conditioning unit 10 and for the primary flow 12 at the delivery toward an environment to be air-conditioned 14, the means 20, 21 for detecting the flow-rate of the primary flow 12 and of the secondary flow 13, the means 22, 23 for detecting the electric power absorbed by the first fans 15 and the second fans 16, an electronic control and management unit 24 adapted to collect and process the data detected by the detection means 17, 18, 19, 20, 21, 22, 23 and, on the basis of such detected data, adapted to adjust the speed of the first fans 15 and the second fans 16.

When the method of operation according to the invention described above is operational, the return temperature at the conditioning unit 10 of the primary flow 12, measured by the first probe 17, is kept constant (for example 37° C.), but the setpoint temperature at the delivery is optimized (lowered from the starting temperature to the minimum temperature) based on the total consumption of the fans (first fans 15 and second fans 16); this is because with very cold outside temperatures there is great availability of cooling, and it is sufficient to only slightly increase the flow-rate of the secondary flow 13 to meet the demand for cooling. This means that the necessary primary air flow 12 is less than the amount needed according to conventional methods of operation, as a consequence reducing the fall in internal pressure, and achieving a significant reduction in the consumption of power.

The secondary air flow 13 required is slightly greater than in the known art, but the total consumption of the conditioning unit 10 is driven by the primary air flow 12.

The temperature at the delivery acquired by the third probe 19 is still compatible with the electronic equipment to be cooled, and the user can still set a setpoint temperature at the delivery that is the minimum acceptable.

Thus, for example, for a class A2 server, by changing the temperature at the inlet for the server from 25° C. to 21° C., the energy consumption is reduced by 2%.

In practice it has been found that the invention fully achieves the intended aim and objects.

In particular, with the invention a conditioning unit has been devised which is capable of carrying out a more efficient heat exchange than similar, conventional conditioning units.

Furthermore, with the invention a conditioning unit has been devised the electricity consumption of which is lower overall with respect to similar, conventional conditioning units.

Moreover, with the invention a conditioning unit has been devised which is capable of improving the electrical efficiency of the computing center in which it is installed.

The invention, thus conceived, is susceptible of numerous modifications and variations, all of which are within the scope of the appended claims. Moreover, all the details may be substituted by other, technically equivalent elements.

In practice the components and the materials employed, provided they are compatible with the specific use, and the contingent dimensions and shapes, may be any according to requirements and to the state of the art.

The disclosures in Italian Patent Application No. PD2014A000319 (102014902311687) from which this application claims priority are incorporated herein by reference.

What is claimed is:

1. A method of operation of a conditioning unit of the indirect free cooling type, the conditioning unit of the type comprising:
    an air/air heat exchanger, inside which two air flows, exchange heat: a primary air flow from and toward an environment to be air-conditioned, and a secondary air flow, or process flow, drawn from outside,
    first fans for moving said primary air flow,
    second fans for moving said secondary air flow, further comprising:
    means for detecting temperature and humidity for the primary flow and the secondary flow at the inlet of said conditioning unit and for said primary flow at the delivery toward an environment to be air-conditioned,
    means for detecting the flow-rate of the primary flow and of the secondary flow,
    means for detecting the electric power absorbed by said first fans and said second fans,
    an electronic control and management unit adapted to collect and process the data detected by said detection means and, on the basis of said detected data, adapted to adjust the speed of said first fans and said second fans, said method comprising the following operations:
    detecting whether the power absorbed by the first fans is greater than the power absorbed by the second fans, minus a tolerance interval,
    if the power absorbed by the first fans is greater than the power absorbed by the second fans, minus the tolerance interval, then the value of the speed of the first fans is reduced, while at the same time keeping a return temperature of the primary flow constant,
    and lowering the speed of the first fans until the following condition is met:
    electric power absorbed by the first fans is equal to electric power absorbed by the second fans plus the tolerance interval.

2. The method of operation according to claim 1, further comprising the following operations:
    setting a setpoint temperature for the primary flow at the outlet of the conditioning unit toward an environment to be air-conditioned, known as the setpoint temperature at the delivery,
    detecting the temperature at the delivery of the primary flow toward the environment to be air-conditioned,
    comparing said detected temperature with said set setpoint temperature, in order to establish whether or not there is a demand for cooling the environment to be air-conditioned,
    if there is no demand for cooling, then the conditioning unit remains in standby,
    if there is demand for cooling, then, after detecting the temperature and humidity of the primary flow that returns from the environment to be air-conditioned, by way of the first probe, and after detecting the external humidity and temperature by way of the second probe, the electronic control unit adjusts the flow-rate of the air of the primary flow and of the secondary flow,
    adjusting the primary air flow by acting on the first fans and adjusting the cooling power by acting on the second fans, which move the secondary flow,
    checking whether the setpoint temperature at the delivery has been reached,
    if the setpoint temperature at the delivery has not been reached, then detecting the flow-rate of the secondary flow by way of the fifth probe and adjusting the cooling power by acting on the second fans, which move the secondary flow,
    if the setpoint temperature at the delivery has been reached, then checking whether the return temperature from the environment to be air-conditioned, measured by the first probe, complies with the adjustment parameter given by the difference between the temperature at the delivery and the return temperature of the primary flow,
    if the return temperature does not comply with the adjustment parameters, then detecting the flow-rate of the primary flow by way of the fourth probe and adjusting the speed of the first fans, which move the primary flow,
    detecting, by way of the first power measurement device, the power absorbed by the first fans,
    detecting, by way of the second power measurement device, the power absorbed by the second fans,
    checking whether the electric power absorbed by the first fans is greater than the electric power absorbed by the second fans plus a tolerance interval,
    if the electric power absorbed by the first fans is not greater than the electric power absorbed by the second fans plus a tolerance interval, then proceed with standard control of the adjustment,
    if the electric power absorbed by the first fans is greater than the electric power absorbed by the second fans plus a tolerance interval, then, with respect to a minimum setpoint temperature that is set for the delivery from the conditioning unit toward the environment to be air-conditioned, decreasing the speed of the first fans,
    iterating from checking whether the setpoint temperature at the delivery has been reached.

3. An apparatus for carrying out a method of operation of a conditioning unit of the type with indirect free cooling, according to claim 1, the conditioning unit further comprising:

means for detecting temperature and humidity for the primary flow and the secondary flow at the inlet of said conditioning unit and for said primary flow at the delivery toward an environment to be air-conditioned, means or detecting the flow-rate of the primary flow and of the secondary flow, means for detecting the electric power absorbed by said first fans and said second fans, an electronic control and management unit adapted to collect and process the data detected by said detection means and, on the basis of such detected data, adapted to adjust the speed of said first fans and said second fans.

4. The conditioning unit according to claim 3, wherein said temperature and humidity detection means for the primary flow at the inlet of the conditioning unit are constituted by a first probe, which is arranged so as to intercept the primary air flow, which arrives from the environment to be air-conditioned, at an inlet region of said conditioning unit.

5. The conditioning unit according to claim 3, wherein said temperature and humidity detection means for the secondary flow at the inlet of the conditioning unit are constituted by a second probe, which is arranged so as to intercept the secondary air flow, which arrives from the outside environment, in a corresponding inlet region of the conditioning unit.

6. The conditioning unit according to claim 3, wherein said temperature and humidity detection means for the primary flow at the outlet of the conditioning unit comprise a third probe.

7. The conditioning unit according to claim 3, wherein said means for detecting the flow-rate of the primary flow are constituted by a fourth probe for determining the flow-rate of the primary air flow at an outlet from the conditioning unit toward the environment to be air-conditioned.

8. The conditioning unit according to claim 3, wherein said means for detecting the flow-rate of the secondary flow are constituted by a fifth probe for determining the flow-rate of the secondary air flow, arranged in an outlet region of the secondary flow from the conditioning unit toward the outside.

9. The conditioning unit according to claim 3, wherein said means for detecting the electric power absorbed by the first fans comprise a first power measurement device for measuring the power absorbed by the first fans.

10. The conditioning unit according to claim 3, wherein said means for detecting the electric power absorbed by the second fans comprise a second power measurement device for measuring the power absorbed by the second fans.

* * * * *